United States Patent
Li et al.

(10) Patent No.: US 7,218,520 B2
(45) Date of Patent: May 15, 2007

(54) RETAINER FOR HEAT SINK

(75) Inventors: Dong-Yun Li, Shenzhen (CN); Hong-Bo Shi, Shenzhen (CN); Min Li, Shenzhen (CN)

(73) Assignees: Fu Zhun Precision Industry (Shen Zhen) Co., Ltd., Shenzhen City, Guangdong Province (CN); Foxconn Technology Co., Ltd., Tu-Cheng City, Taipei Hsien (TW)

( * ) Notice: Subject to any disclaimer, the term of this patent is extended or adjusted under 35 U.S.C. 154(b) by 334 days.

(21) Appl. No.: 10/930,385

(22) Filed: Aug. 31, 2004

(65) Prior Publication Data

US 2005/0237720 A1    Oct. 27, 2005

(30) Foreign Application Priority Data

Apr. 24, 2004   (CN) .................. 2004 2 0045418 U

(51) Int. Cl.
*H05K 7/20*     (2006.01)
(52) U.S. Cl. ...................... 361/704; 361/710; 361/719; 165/80.3; 165/185; 24/458; 248/510; 174/16.3; 257/718; 257/727
(58) Field of Classification Search ............... 361/697, 361/704, 709–710, 717–719; 165/80.3–185; 174/16.3; 257/718, 727; 24/458, 457, 618, 24/625; 248/505, 510
See application file for complete search history.

(56) References Cited

U.S. PATENT DOCUMENTS

| 6,924,982 | B2 * | 8/2005 | Chen et al. .................. 361/697 |
| 6,924,984 | B2 * | 8/2005 | Lee et al. .................... 361/704 |
| 6,934,153 | B2 * | 8/2005 | Lee et al. .................... 361/697 |
| 6,944,026 | B2 * | 9/2005 | Lee et al. .................... 361/719 |
| 6,977,816 | B2 * | 12/2005 | Lee et al. .................... 361/704 |
| 6,978,827 | B2 * | 12/2005 | Armstrong ................. 165/80.3 |
| 6,988,871 | B2 * | 1/2006 | Deboer et al. .............. 415/176 |
| 7,072,183 | B2 * | 7/2006 | Lee et al. .................... 361/704 |
| 7,075,790 | B2 * | 7/2006 | Chen et al. ................. 361/704 |

* cited by examiner

*Primary Examiner*—Michael Dakskovsky
*Assistant Examiner*—Robert J. Hoffberg
(74) *Attorney, Agent, or Firm*—Morris Manning & Martin LLP; Tim Tingkang Xia, Esq.

(57) ABSTRACT

A retainer includes a retention module surrounding a heat sink and two clip members for cooperating with the retention module to retain the heat sink. Each clip member includes a strap resting on the heat sink and a pair of legs located at opposite ends of the strap and engagable with the retention module. The legs are pivotably attached to opposite ends of the strap. Friction between the legs and the strap is capable of holding the legs at any positions between released positions at which the legs are free from the retention module and engaged positions at which the legs are engaged with the retention module.

20 Claims, 5 Drawing Sheets

RETAINER FOR HEAT SINK

TECHNICAL FIELD

The present invention relates to a retainer, and particularly to a retainer for conveniently mount a heat sink to a heat generating unit.

BACKGROUND

As computer technology continues to advance, electronic components such as central processing units (CPUs) of computers are made to provide faster operational speeds and greater functional capabilities. When a CPU operates at a high speed in a computer enclosure, its temperature can increase greatly. It is desirable to dissipate the generated heat quickly, for example, by using a heat sink attached to the CPU in the enclosure. This allows the CPU and other high-performance electronic components in the enclosure to function within their normal operating temperature ranges, thereby assuring the CPU quality of data management, storage and transfer. Oftentimes, a retainer is required for mounting the heat sink to the CPU.

One conventional retainer developed to mount a heat sink to a CPU is illustrated in FIG. 5. The retainer comprises a retention module 97 and two clips 90. The retention module 97 comprises four locking feet 98 formed at four corners thereof. Each locking foot 98 defines a locking opening 99 therein. Each clip 90 comprises an elongate strap 93 and a cam-type lever 92 pivotally connected to a middle of the strap 93. Two opposite ends of the strap 93 integrally extend downwardly to form a pair of legs 94. A hook 95 is formed at a bottom portion of each leg 94 corresponding to a respective locking opening 99 of the retention module 97. The retention module 97 is fixed on a printed circuit board around a CPU (not shown), and a heat sink (not shown) is mounted on the CPU. In assembly, the clips 90 are placed on opposite sides of the heat sink. The straps 93 of the two clips 90 are downwardly pressed to cause the hooks 95 to interlock with the corresponding legs 94 at the locking openings 99. However, the clip 90 is integral formed and therefore has a large rigidity. As a result, large force is needed in operation. Furthermore, the legs 94 of the clips 90 are prone to slide over the feet 98 to damage the CPU when the large force is applied.

SUMMARY OF THE INVENTION

Accordingly, an object of the present invention is to provide a retainer which can conveniently mount a heat sink to a heat generating unit without damaging the heat generating unit.

To achieve the above-mentioned object, a retainer in accordance with the present invention comprises a retention module surrounding a heat sink and two clip members for cooperating with the retention module to retain the heat sink. Each clip member comprises a strap resting on the heat sink and a pair of legs located at opposite ends of the strap and engagable with the retention module. At least one of the legs is pivotably attached to one of opposite ends of the strap. Friction between the at least one leg and the strap is capable of holding the leg at any position between a released position at which the leg is free from the retention module and an engaged position at which the leg is engaged with the retention module.

Other objects, advantages and novel features of the present invention will be drawn from the following detailed description of a preferred embodiment of the present invention together with the attached drawings, in which:

DETAILED DESCRIPTION OF A PREFERED EMBODIMENT

Figure 1:
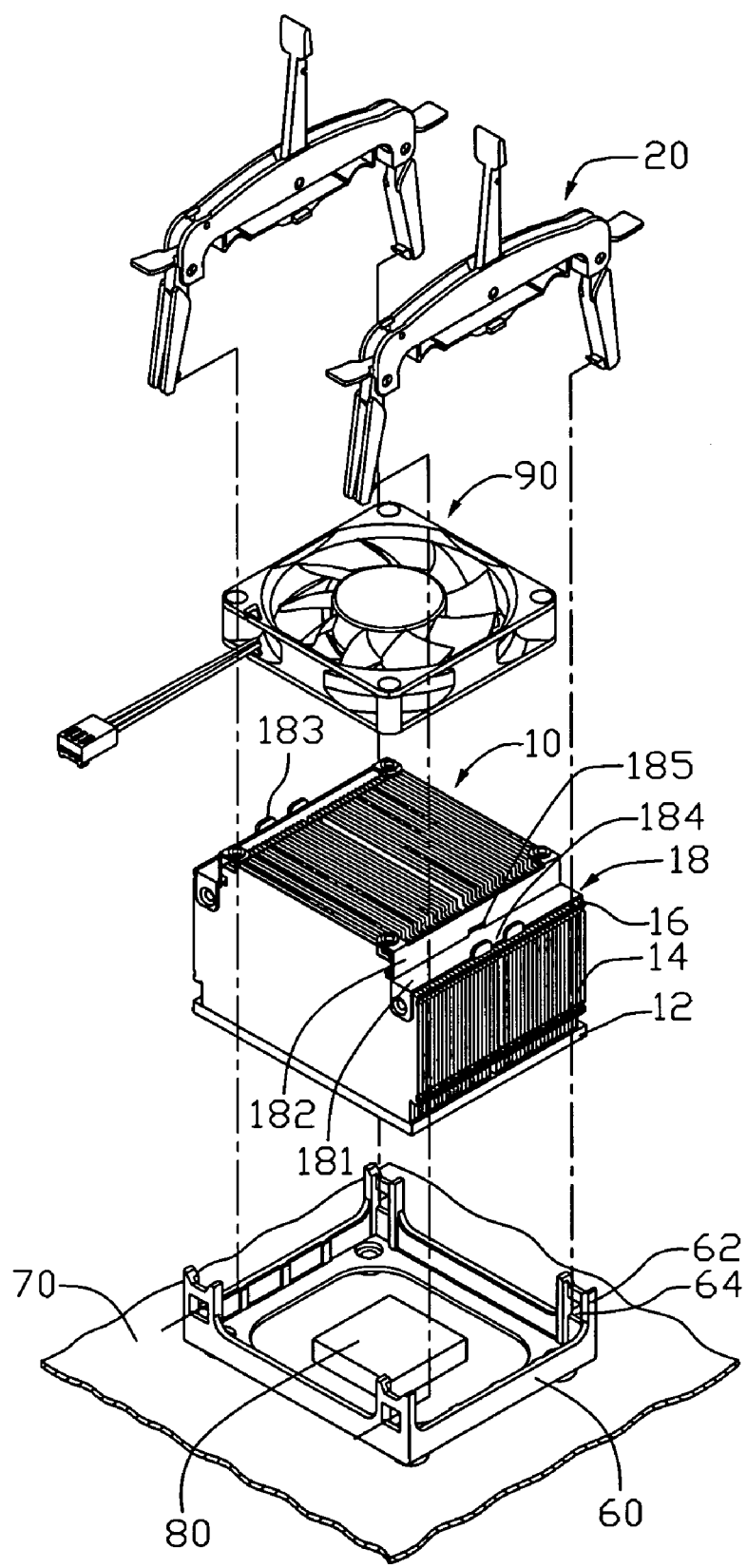
FIG. 1 is an isometric view of a retainer in accordance with a preferred embodiment of the present invention, together with a heat sink with a fan and a heat generating unit.

Referring to FIG. 1, a retainer for mounting a heat sink 10 on a CPU 80 mounted on a printed circuit board 70 is shown. The retainer comprises two clip members 20 and a retention module 60. The heat sink 10 comprises a base 12 for contacting the CPU 80, and a plurality of parallel fins 14 extending upwardly from the base 12. Two shoulders 16 are formed at opposite sides of the fins 14. A pair of supporting members 18 with a plate configuration is attached on the shoulders 16. Each supporting member 18 has a horizontal portion 181 and a vertical portion 182. The outer side edge of each horizontal portion 181 forms a tab 183 defining a cutout 184 therein. The vertical portion 182 defines a cutout 185 aligned with the corresponding cutout 184. Four mounting portions (not labeled) are formed at four corners of the vertical portion 182 for mounting a fan 90 thereon.

The retention module 60 is mounted on the printed circuit board 70 around the CPU 80. The retention module 60 comprises four locking feet 62 formed at four corners thereof. Each locking foot 62 defines a locking opening 64 therein.

Figure 2:
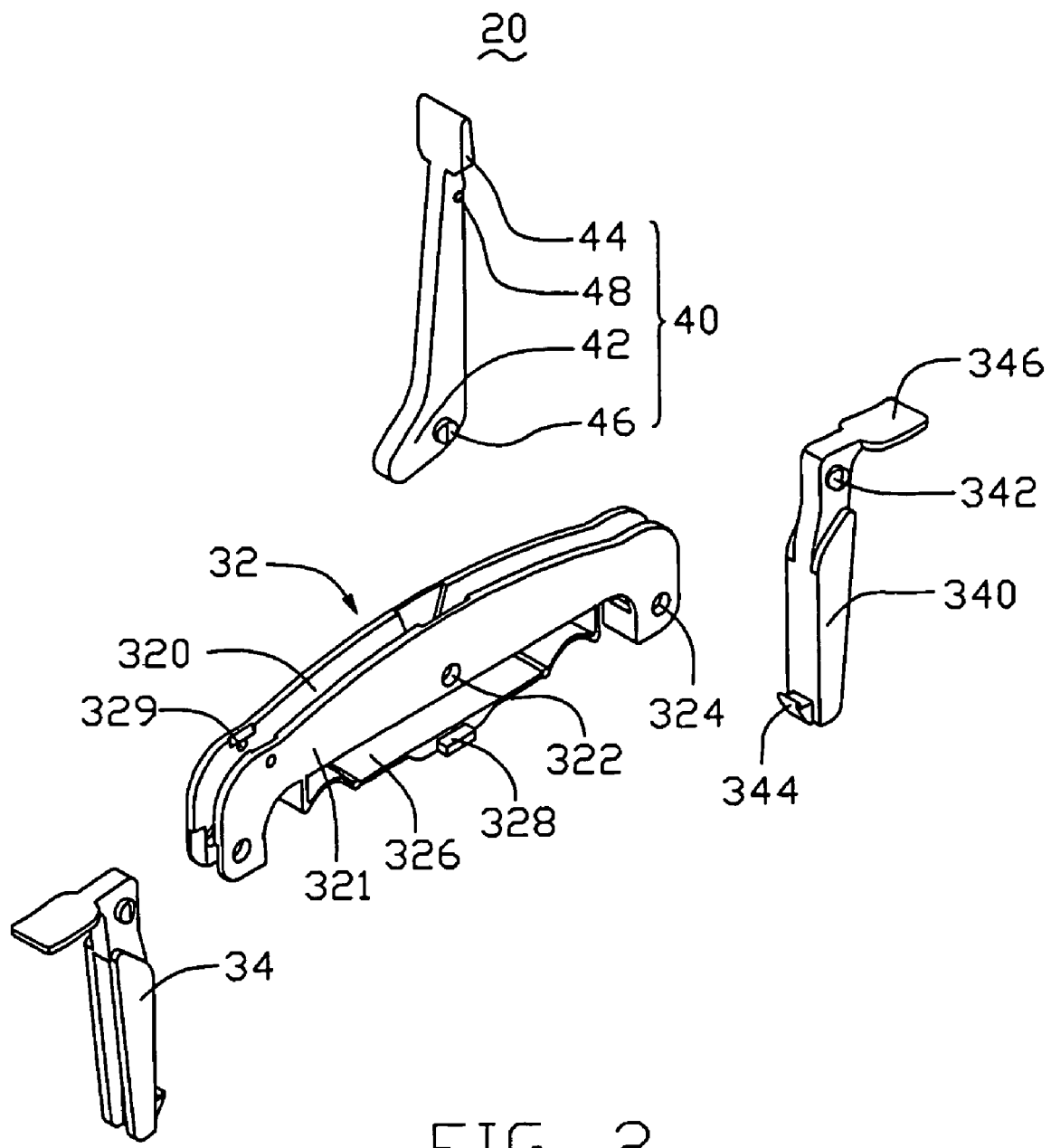
FIG. 2 is an exploded view of a clip member of the retainer of FIG. 1.

Referring to FIG. 2, each clip member 20 comprises an elongate strap 32, a pair of legs 34 and a lever 40. The strap 32 defines a through groove 320 spanning from one end thereof to an opposite end thereof. The strap 32 is therefore divided into two parts 321 connected by connecting bars (not labeled). A pair of coaxial pivot holes 322 is defined in middle portions of the parts 321. The pivot holes 322 are in communication with the groove 320. Another pair of coaxial pivot holes 324 is defined in each of opposite end portions of the parts 321, and in communication with the groove 320 as well. A pair of retaining holes 329 is defined in the strap 32 adjacent to one end thereof. A pressing pad 326 extends downwardly from a bottom surface of the parts 321. Two protrusions 328 extend outwardly from opposite sides of the pressing pad 326.

Each leg 34 comprises a main body 340 and a handle 346 connected with a top end of the main body 340. A hook 344 is formed at a bottom portion of the main body 340 corresponding to one of the locking openings 64 of the retention module 60. A pair of pivots 342 is formed on opposite sides of an upper portion of the main body 340. The pivots 342 are receivable in the corresponding pivot holes 324 of the strap 32 to thereby pivotably attach the leg 34 to the strap 32. The thickness of the upper portion of the main body 340 received in the groove 320 is slightly greater than the width of the groove 320 of the strap 32 before the legs 34 attached to the strap 32. The legs 34 are pivotable in the groove 320 interferentially and friction generated between the legs 34 and the strap 32 can hold the legs 34 at any position when the legs 34 rotate.

The lever 40 comprises a cam 42 formed at one end thereof, and a handle 44 extending from the cam 42. A pair of pivots 46 is formed on opposite sides of the junction of the cam 42 and the handle 44. A pair of protrusions 48 is formed on opposite sides of the other end of the lever 40. The cam 42 is extended through the groove 320. The pivots 46 are received in the corresponding pivot holes 322 of the strap 32, thereby pivotably attaching the lever 40 to the strap 32. The lever 40 can rotate between a vertical position and a horizontal position. The distance between the bottommost point of the cam 42 and the pivot 46 in the vertical direction when the lever 40 locates at the vertical position is smaller than that when the lever 40 locates at the horizontal position. The distance is minimum when the lever 40 is located at the vertical position, and is maximal when the lever 40 is located at the horizontal position.

Figure 3:
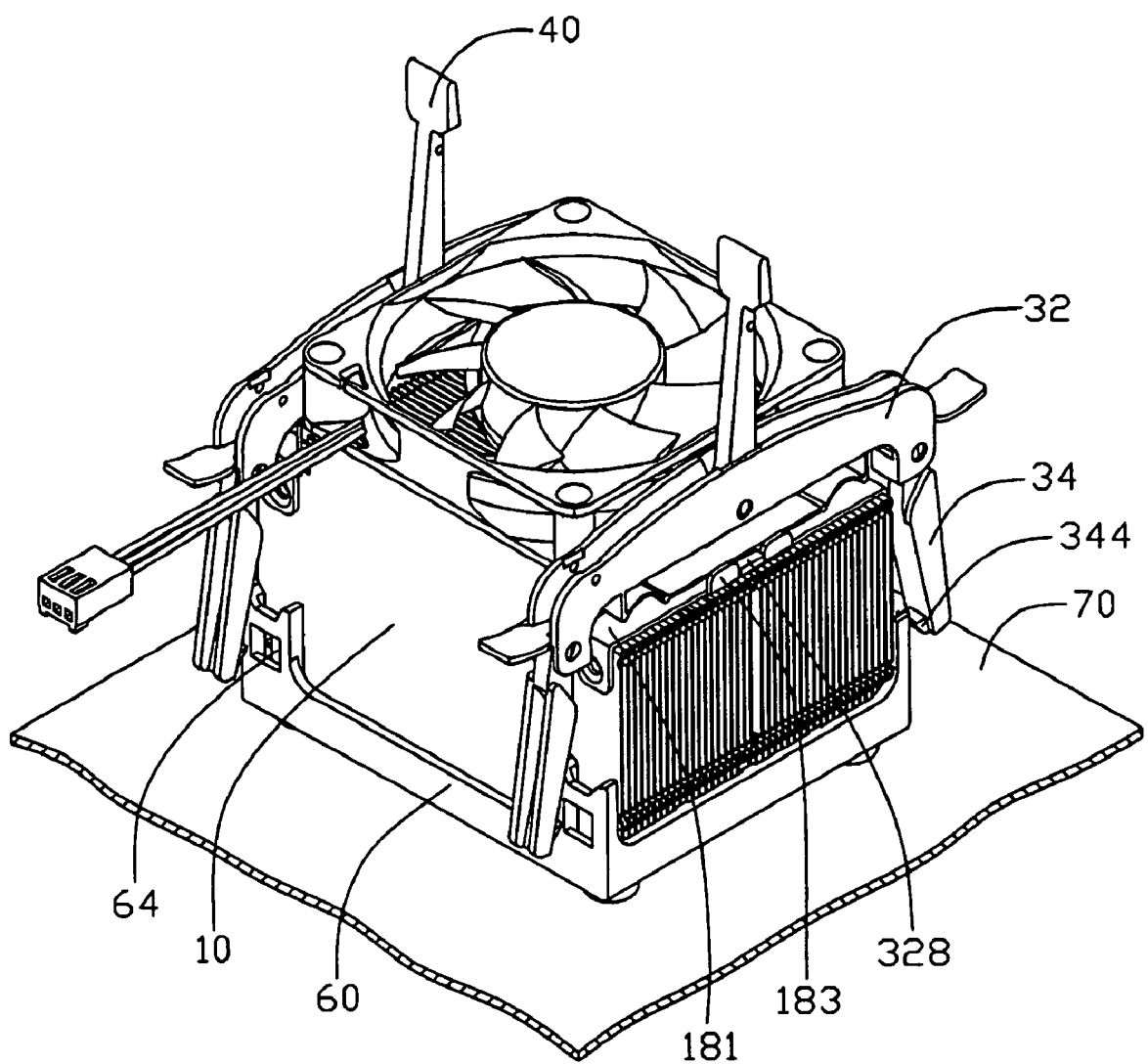
FIG. 3 is an assembled view of FIG. 1 showing the retainer at the released position.
Figure 4:
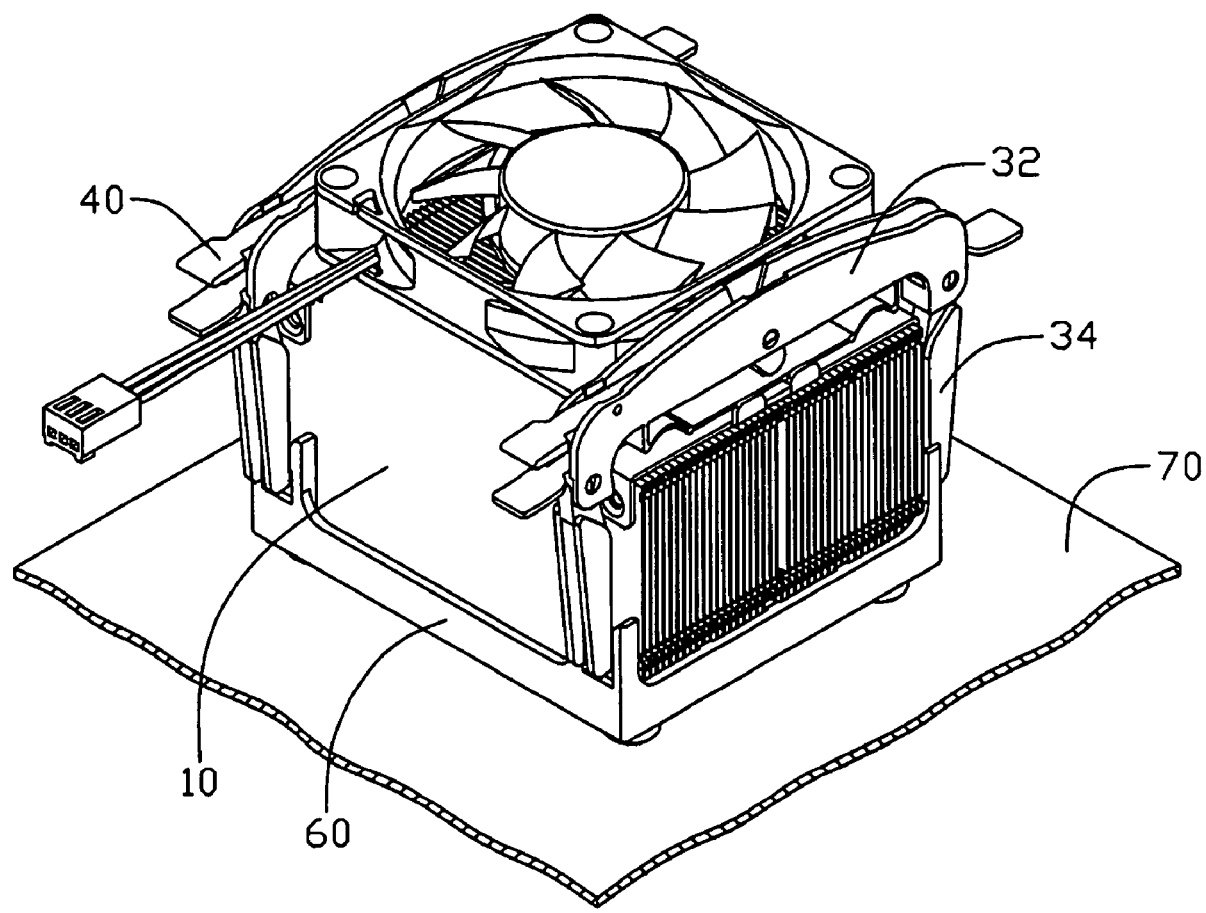
FIG. 4 is similar to FIG. 3 but showing the retainer at the engaged position.
Figure 5:
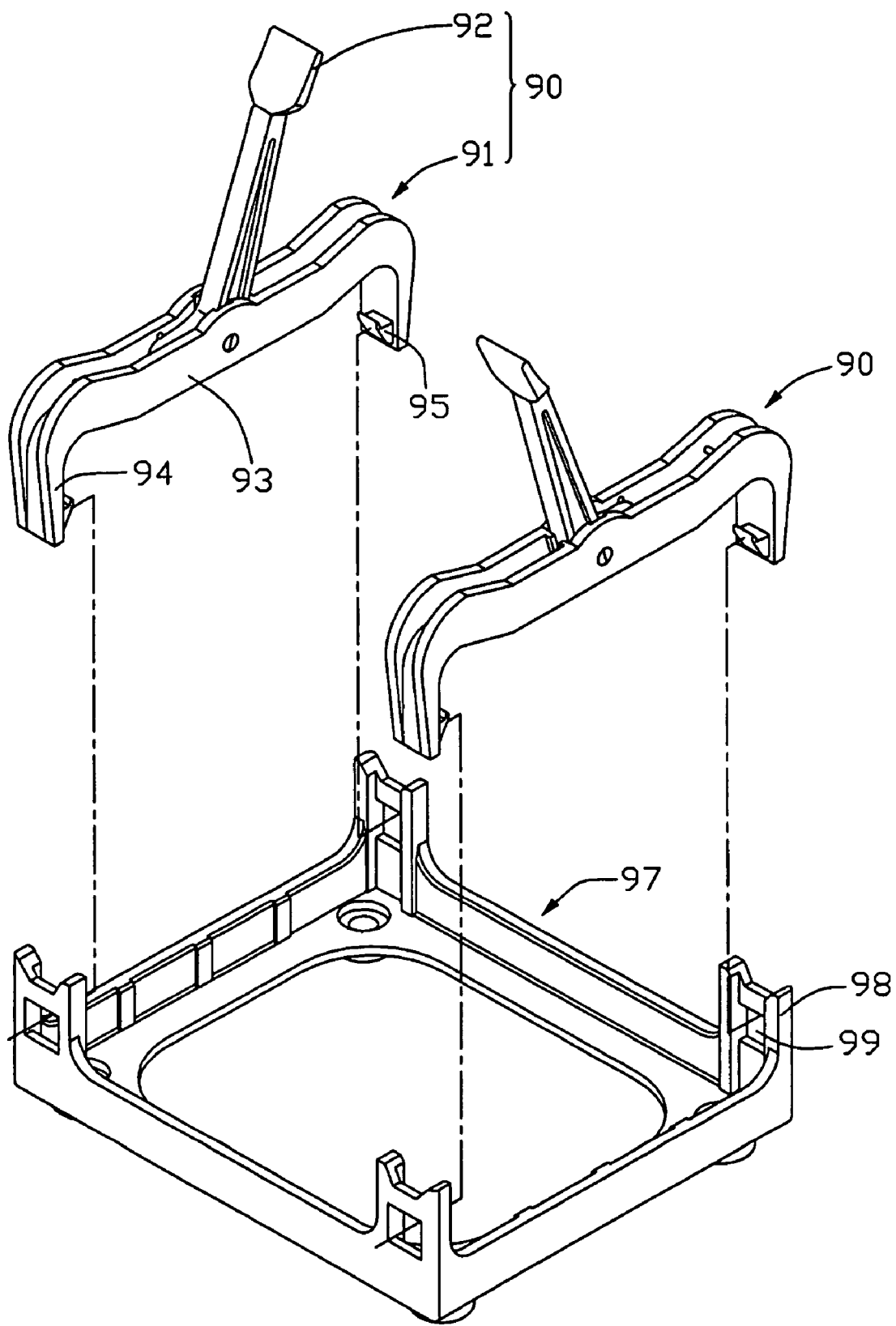
FIG. 5 is an exploded view of a conventional retainer for a heat sink.

Referring to FIGS. 3–4, in assembly, the heat sink 10 is mounted on the CPU 80 within the retention module 60. The legs 34 of each clip member 20 rotate outwardly to be held at a released position by friction generated between the legs 34 and the strap 32. The clip members 20 are then placed on the corresponding horizontal portions 181 of the supporting members 18 with the protrusions 328 inserted in the cutouts 184, 185 of the supporting members 18. The levers 40 are located at the vertical positions at this moment. The legs 34 of the clip members 20 rotate inwardly by operation on the handles 346 until the hooks 344 of the legs 34 are received in the corresponding locking openings 64 of the retention module 60. The levers 40 are then pivoted to the horizontal positions. At this state, the bottommost points of the cams 42 abut against the pressing pad 326 which rest on the supporting members 18. The straps 32 are therefore pushed upwardly to thereby cause the hooks 344 of the legs 34 to firmly engage in the locking openings 64 of the retention module 60. Simultaneously, the supporting members 18 are pressed downwardly to thereby cause the heat sink 10 to intimatly contact the CPU 80. The protrusions 48 of the levers 40 are received in the retaining holes 329 of the parts 321 of the strap 32 for preventing the levers 40 from moving to the vertical positions unexpectedly.

Alternatively, the two clip members 20 are made integrally by using a bar (not shown) to connect the levers 40 with each other.

In the present invention, the legs 34 of the clip members 20 firstly rotate outwardly to be held at the released positions. The legs 34 of the clip members 20 then inwardly rotate to cause the hooks 344 to enter into the locking openings 64 of the retention module 60 after the clip members 20 have been placed on the horizontal portions 181 of the supporting members 18. Then, the levers 40 rotate to cause the legs 34 to firmly engage with the retention module 60 in the locking openings 64. Therefore, the hooks 344 of the legs 34 can be conveniently engaged in the locking openings 64 of the retention module 60 without bumping the heat sink 10 and damaging the CPU 80.

It is understood that the invention may be embodied in other forms without departing from the spirit thereof. Thus, the present examples and embodiments are to be considered in all respects as illustrative and not restrictive, and the invention is not to be limited to the details given therein.

What is claimed is:

1. A retainer for a heat sink, comprising:
   a retention module adapted for surrounding the heat sink; and
   two clip members for cooperating with the retention module to retain the heat sink, each clip member comprising:
   a strap adapted for resting on the heat sink;
   a pair of legs located at opposite ends of the strap and engagable with the retention module, at least one of the legs being pivotably attached to one of opposite ends of the strap, friction between said leg and the strap being capable of holding said leg at any position between a released position at which said leg is free from restriction of the retention module and an engaged position at which said leg is engaged with the retention module; and
   at least one protrusion formed on the strap, wherein the at least one protrusion is for engaging with the heat sink so as to locate the clip members on the heat sink.

2. The retainer as described in claim 1, wherein the strap defines a through groove spanning from one end thereof to an opposite end thereof.

3. The retainer as described in claim 2, wherein a portion of said leg is received in the groove of the strap, and a thickness of said portion of said leg is slightly greater than a width of the groove of the strap before said portion is received in the groove.

4. The retainer as described in claim 3, wherein said leg comprises a main body.

5. The retainer as described in claim 4, wherein said leg further comprises a handle connected with a top end of the main body.

6. The retainer as described in claim 4, wherein at least one end portion of the strap defines two coaxial pivot holes communicating with the groove, and opposite sides of an upper portion of said leg form a pair of pivots received in the corresponding pivot holes of the strap.

7. The retainer as described in claim 1, further comprising a lever with a cam pivotably attached to a middle portion of the strap.

8. The retainer as described in claim 1, further comprising a pair of supporting members for mounting to the heat sink, each supporting member having at least one cutout, wherein the strap rests on a corresponding supporting member with the at least one protrusion inserting into the at least one cutout of the corresponding supporting member, and wherein the clip members engage with the heat sink via the supporting members so as to locate the clip members on the heat sink.

9. The retainer as described in claim 8, wherein each of the clip members further comprises a pressing pad formed below the strap and resting on the corresponding supporting member.

10. The retainer as described in claim 9, wherein the at least one protrusion extends from the pressing pad.

11. The retainer as described in claim 8, wherein the supporting members each define a pair of cutouts, and each of the clip members comprises two protrusions received in the cutouts of the each supporting member respectively.

12. The retainer as described in claim 1, wherein the engagements between the protrusions of the two clip members prevent each of the two clip members from moving relative to the heat sink along two perpendicular directions.

13. A heat dissipating device assembly for a heat generating unit, comprising:
- a heat sink adapted for being placed on the heat generating unit;
- a retainer for mounting the heat sink to the heat generating unit, comprising a retention module adapted for being located about the heat generating unit, and two clip members each comprising:
- a strap resting on the heat sink;
- a pair of legs located at opposite ends of the strap, at least one of the legs being movably attached to one of opposite ends of the strap and being holdable by the strap at a released position at which said leg is free from restriction of the retention module; and
- a lever attached to the strap and being pivotable from a first position to a second position to cause the legs to engage with the retention module, and to have the lever pressing the heat sink toward the heat generating unit;
- wherein the heat sink comprises a base and a plurality of fins, and opposite sides of the fins form a pair of shoulders therein;
- wherein a pair of supporting members is attached on the shoulders, and the clip members further comprise pressing pads formed below the straps and resting on the corresponding supporting members; and
- wherein each supporting member defines a pair of aligned cutouts, and each pressing pad of the clip member forms two aligned protrusions received in the cutouts of the supporting member respectively.

14. The heat dissipating device assembly as described in claim 13, wherein the strap defines a through groove spanning from one end thereof to an opposite end thereof.

15. The heat dissipating device assembly as described in claim 14, a portion of said leg is received in the groove of the strap, and a thickness of said portion of said leg is slightly greater than a width of the groove of the strap before said portion is received in the groove.

16. The heat dissipating device assembly as described in claim 13, wherein said legs each further comprise a handle connected with a top end of the each leg.

17. The heat dissipating device assembly as described in claim 13, further comprising a fan mounted on the supporting members.

18. A clip member for cooperating with a retention member to retain a heat sink, the clip member comprising:
- a strap defining a through groove spanning from one end thereof to an opposite end thereof;
- a pair of legs located at opposite ends of the strap, at least one of the legs being pivotably attached to one of opposite ends of the strap and one portion of said at least one leg being interferentially received in the groove whereby said leg is capable of being held at a release position at which said leg is free from restriction of the retention member; and
- a cam-type lever pivotably attached to the strap so as to move said heat sink in a direction away from said lever.

19. The clip member as described in claim 18, further comprising a pressing pad formed below the strap for pressing the heat sink.

20. The clip member as described in claim 18, further comprising a handle defined from each of said pair of legs.

* * * * *